United States Patent
Duncan et al.

(10) Patent No.: US 6,459,517 B1
(45) Date of Patent: Oct. 1, 2002

(54) ENHANCED ELECTROMAGNETIC INTERFERENCE SHIELD

(75) Inventors: Timothy Paul Duncan, Zumbrota; John Stephen Maas, Kasson; James Larry Peacock; Scott Marvin Thorvilson, both of Rochester, all of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/241,730

(22) Filed: Feb. 2, 1999

(51) Int. Cl.[7] ............................................. H04B 10/00
(52) U.S. Cl. .................. 359/152; 359/153; 359/161; 361/752; 361/816; 361/818; 361/799; 361/800; 24/563; 439/607; 439/610; 174/35 R; 174/51; 385/88; 385/92
(58) Field of Search .................. 359/152, 153, 359/161; 385/88, 92 V; 361/752, 818, 816, 799, 800; 174/35 R, 51; 24/563; 439/607, 610

(56) References Cited

U.S. PATENT DOCUMENTS

| | | | | |
|---|---|---|---|---|
| 3,835,443 A | * | 9/1974 | Arnold et al. | 339/90 |
| 5,202,943 A | * | 4/1993 | Carden et al. | 385/92 |
| 5,323,299 A | * | 6/1994 | Weber | 361/818 |
| 5,434,747 A | * | 7/1995 | Shibata | 361/753 |
| 5,528,408 A | * | 6/1996 | McGinley et al. | 359/152 |
| 5,757,998 A | * | 5/1998 | Thatcher et al. | 385/75 |
| 5,811,050 A | * | 9/1998 | Gabower | 264/299 |
| 5,901,263 A | * | 5/1999 | Gaio et al. | 385/92 |
| 5,917,708 A | * | 6/1999 | Moran et al. | 361/800 |
| 5,929,377 A | * | 7/1999 | Hamilton et al. | 174/35 R |
| 6,085,006 A | * | 7/2000 | Gaio et al. | 385/92 |
| 6,092,281 A | * | 7/2000 | Glenn | 29/841 |
| 6,200,041 B1 | * | 3/2001 | Gaio et al. | 385/92 |
| 6,252,313 B1 | * | 6/2001 | Zhang et al. | 307/91 |

* cited by examiner

Primary Examiner—Leslie Pascal
Assistant Examiner—Hanh Phan
(74) Attorney, Agent, or Firm—Rabin & Berdo, PC; Robert H. Berdo, Jr.

(57) ABSTRACT

An electromagnetic interference shielding arrangement, includes a duplex optical transceiver having a light-emitter and a light-receiver disposed adjacent to each other and at an end of the optical transceiver. A first electromagnetic interference shield covers a major portion of the optical transceiver. A tailstock has an aperture disposed in alignment with the end of the optical transceiver. A second electromagnetic interference shield is positionable to shield the end of the optical transceiver. The second electromagnetic interference shield includes a pipe formed from a conductive material. The pipe has two opposing openings, and an axis extending from one of the openings to the other of the openings. The pipe has a profile that corresponds to a profile of the end of the optical transceiver. A septum is attached to the pipe. The septum is formed from a conductive material. The septum is arranged to extend in a direction that is at an angle to the axis.

28 Claims, 4 Drawing Sheets

ENHANCED ELECTROMAGNETIC INTERFERENCE SHIELD

BACKGROUND OF THE INVENTION

1. Field of the Invention

The present invention relates to an enhanced electromagnetic interference shield, and in particular, to an electromagnetic interference shield that significantly reduces electromagnetic interference emissions from an optical transceiver, for example.

2. Background Information

Many electrical devices, when operated, generate emissions that include electromagnetic radiation. When this electromagnetic radiation influences the proper functioning of another device, the result is known as electromagnetic interference (also known as EMI).

In order to ensure that electromagnetic radiation is emitted only at acceptable levels, i.e., to prevent electromagnetic interference, various standards have been developed. For example, both the United States and Canada have determined acceptable electromagnetic radiation emission limits for electrical devices operating at set frequencies. If the electrical device exceeds the determined acceptable emission limits, the sale or use of the electrical device may be prohibited.

Various shield devices are known that can be used to reduce emitted electromagnetic radiation. The conventional shields typically cover a substantial portion of the associated electrical device, and are usually formed of a metal that, when grounded, will attenuate the electromagnetic radiation. However, shields will typically have one or more apertures (openings) formed therein, to allow for the passage of electrical or fiber-optic cables, for example, which are used to couple the shielded electrical device to other associated components. These apertures may allow for the passage of emitted electromagnetic radiation (in the form of electromagnetic radiation waves), thus raising the possibility of electrical magnetic interference.

However, it is known that an aperture will attenuate electromagnetic radiation waves when the aperture is less than ½ of the wavelength λ to be attenuated (i.e., length of aperture <½λ). Moreover, the smaller the aperture, the greater the attenuation of the electromagnetic radiation waves. The attenuation of electromagnetic radiation waves due to passage through an aperture can be determined using the following formula:

$$S = 20 \log (\lambda/2L), \text{ where}$$

S=the shielding effectiveness of the aperture (in decibels);
λ=the wavelength of the electromagnetic radiation; and
L=the maximum linear length of the aperture (in meters).

Moreover, the wavelength λ can be determined by dividing the velocity of the electromagnetic radiation wave (i.e., the wave speed, which is approximately $3 \times 10^8$ m/sec$^2$) by the frequency of the electromagnetic radiation emissions.

Thus, as the operational frequency (and hence, speed) of an electrical device increases, the associated wavelengths become smaller, thus requiring smaller apertures. However, the apertures are typically limited in minimum size to allow for the passage of associated cables, for example. If the size of the apertures are reduced too much, then passage of the associated cables therethrough may be prohibited. Therefore, it is clear that the size of the aperture, which typically has a minimum size, may limit the speed (i.e., bandwidth) of the associated electrical device.

As an example, optical transceivers use pulses of light to carry signals and transmit and receive data at very high speeds. Typically, the light pulses are converted into, or converted from, associated electrical signals using known circuitry. Such optical transceivers are often used in devices, such as computers, in which data must be transmitted at high rates of speed.

Optical transceivers may use light emitting diodes (LEDs) or lasers to transmit the light pulses, and a photodiode to receive light pulses. Typically, the photodiode is located adjacent to the LED or laser, to form a so-called duplex optical transceiver. Fiber-optic cables are then coupled to the respective LED or laser, and the photodiode, so that the light pulses can be transmitted to and from other optical transceivers, for example.

Further, optical transceivers typically have standard sizes and shapes, so that they may be readily incorporated into a computer system, for example, without modification. For instance, a typical duplex optical transceiver has a length of 39.12 millimeters, a width of 25.40 millimeters, and a thickness of 10.35 millimeters.

The optical transceivers are normally located on either input/output cards or port cards that are connected to an input/output card. In order to facilitate the connection of the fiber-optic cable to the optical transceiver, the transceiver is usually located on a periphery of the card.

Moreover, in a computer system, for example, the input/output card (with the optical transceiver attached thereto) is typically connected to a circuit board, for example a mother board. The assembly may then be positioned within a chassis, which is a frame fixed within a computer housing. The chassis serves to hold the assembly within the computer housing.

The LED or laser, and the photodiode are typically operated at a very rapid speed in order to transmit and receive data. For example, a typical high-speed optical transceiver may transmit or receive up to 622 megabits/second. In order to transmit, for example, data at this speed, the LED or laser must be repeatedly activated and deactivated 622 million times per second. This rapid switching action generates large amounts of electromagnetic radiation. Likewise, the rapid operation of the photodiode will generate a large amount of electromagnetic radiation.

As is known, it is only at harmonics of an operational frequency that potentially harmful electromagnetic radiation emissions occur. For example, the aforementioned high-speed optical transceiver, when transmitting or receiving 622 megabits per second, operates at a frequency of about 622 MHz. This operational frequency does not generally generate problematic electromagnetic interference. However, harmful emissions may be generated at the harmonics of this frequency, i.e., at 1.244 GHz, 1.866 GHz, 2.488 GHz, etc. Moreover, the third harmonic frequency is generally one of the more difficult frequencies to attenuate (i.e., at 2.488 GHz in the aforementioned scenario).

If the frequencies of the emitted electromagnetic radiation are not sufficiently attenuated, electromagnetic interference may affect the performance of other components, for example other input/output components, that are either located on the same card as the optical transceiver or that are located on other cards. The electromagnetic interference may cause other input/output components, for example, to either transmit or receive faulty data, thus affecting the operation of the overall system.

To prevent electromagnetic interference from having an adverse affect on other components, it is known to keep optical transceivers adequately spaced apart from other components. However, this disadvantageously limits the number of components that can be placed within a predetermined area. Moreover, more area is needed to accommodate a set number of components with a predetermined spacing therebetween. However, as is readily known, the trend in computer systems, for example, is to provide more functionality in less space. Thus, keeping the optical transceivers separated from other components may not be a practical solution.

Alternatively, it is also known to use a chassis of a computer system, for example, which has the card containing the optical transceiver mounted thereto, as a shield to block the electromagnetic radiation from permeating to other devices. However, the chassis typically only holds the periphery of the card, and will not prevent electromagnetic interference from affecting other components that may be located on the same card as the optical transceiver.

Moreover, because the chassis does not completely encapsulate the card containing the optical transceiver, the typical chassis is only able to serve as a shield when the electromagnetic radiation emissions are relatively low. For example, optical transceivers that have a speed in the range of 155 megabits/second do not emit large amounts of electromagnetic radiation. With these low-speed optical transceivers, a chassis may help reduce the level of electromagnetic radiation so as to fall within industry standards. However, as the speed of optical transceivers increases, for example to a speed of approximately 622 megabits/second, the amount of electromagnetic radiation produced increases to a level where the standard chassis provides inadequate shielding.

Additionally, modifying the typical chassis so as to completely surround the card holding the optical transceiver, in order to provide increased shielding, is problematic. The resulting configuration would disadvantageously make it more difficult to remove and replace the cards from the chassis.

It is also known to provide a card-mounted shield which covers the optical transceiver in order to reduce the amount of electromagnetic radiation that is emitted from the transceiver. The shield is typically attached to the card that the optical transceiver is fastened to, grounded in a known manner, and covers the body of the optical transceiver. However, the typical conventional optical transceiver shield, when properly positioned over a standard optical transceiver, is completely open at its end, to allow for the passage of a fiber-optic cable. However, it has been determined that a majority of the electromagnetic radiation emitted by optical transceivers is emitted at the end of the transceiver that transmits and receives the light and is attached to the external cable (i.e., the end that is not shielded by the typical shield). Thus, the known optical transceiver shield disadvantageously does not prevent a majority of the electromagnetic radiation from permeating to other components. Therefore, there is a need for an electromagnetic interference shield that attenuates the electromagnetic radiation passing from an end of an optical transceiver.

Moreover, it is conventional to extend the end of the optical transceiver that transmits and receives the light through an aperture in a so-called tailstock. A tailstock is a plate that provides physical support for the associated electrical device (for example, the optical transceiver), and which may provide for a limited amount of electromagnetic radiation shielding in some situations. However, the aperture in the tailstock must be sized to allow the end of the optical transceiver to pass therethrough. As such, the aperture in the tailstock does not attenuate any of the electromagnetic radiation that is emitted through the end of the optical transceiver. Thus, there is a need for an electromagnetic interference shield that provides an aperture of a size significantly reduced relative to a size of an end of an optical transceiver, so as to attenuate electromagnetic radiation emitted from the end of the optical transceiver to acceptable levels.

Additionally, the conventional card-mounted shield is not tailored to extend through the aperture in the tailstock. As such, the end of the optical transceiver is conventionally not provided with any shielding at its periphery. This may disadvantageously allow further electromagnetic radiation to be emitted into the surrounding environment. Thus, there is a need for an electromagnetic interference shield that is tailored to cover a periphery of an end of an optical transceiver, and which will still allow the end of the optical transceiver to fit through a standard size aperture in a tailstock.

Another known solution for reducing electromagnetic radiation is to provide circuitry within or coupled to the optical transceiver to limit the effects of the electromagnetic radiation. Such circuitry is often tailored to limit the amount of electromagnetic radiation that is produced by the optical transceiver, and to eliminate as much of the produced electromagnetic radiation as possible. However, this circuitry disadvantageously increases the design complexity of the optical transceiver. The increased design complexity will raise the cost of the device, as the additional circuitry will need to be designed, tested, and manufactured. Moreover, the complex design may result in an optical transceiver that is much larger in size. Additionally, the circuitry may not be successful in reducing the electromagnetic radiation below industry standards, thus necessitating additionally shielding using other known methods. Thus, there is a need for a shield that reduces electromagnetic radiation to acceptable limits, without requiring special circuitry.

SUMMARY OF THE INVENTION

It is, therefore, a principle object of this invention to provide an enhanced electromagnetic interference shield.

It is another object of the invention to provide an enhanced electromagnetic interference shield that solves the above mentioned problems.

These and other objects of the present invention are accomplished by the enhanced electromagnetic interference shield disclosed herein.

According to one aspect of the invention, the electromagnetic interference shield includes a hollow member, such as a pipe that has a central axis, and that is open at opposing ends. Further, the pipe preferably has a rectangular cross-sectional profile, and is defined by four contiguous, connected walls, each of which is arranged at a right angle to an adjoining wall. Although other arrangements are within the scope of the invention, this particular configuration advantageously conforms the electromagnetic interference shield to the shape of a standard optical transceiver, which likewise has a rectangular cross-sectional profile. Moreover, although the configuration of the electromagnetic interference shield has been defined with respect to an axis, this does not require the shield to have a symmetrical configuration. To the contrary, the shield may be unsymmetrical relative to its axis.

According to yet a further aspect of the present invention, the electromagnetic interference shield advantageously slips over the end of the optical transceiver, so as to totally encapsulate the end periphery of the optical transceiver.

Alternatively, it is also contemplated that the electromagnetic interference shield may be slipped within the end of the optical transceiver. Thus, the electromagnetic interference shield is easily and quickly positionable in its proper location.

Moreover, the electromagnetic interference shield advantageously shields the end region of the optical transceiver that is typically not covered using a conventional shield. Thus, the electromagnetic interference shield according to the present invention, when used in conjunction with a conventional shield, significantly increases the shielding coverage, as compared to the shielding effect provided using only a conventional shield.

According to a further exemplary embodiment of the invention, the electromagnetic interference shield is advantageously provided with a septum which extends between opposing sides of the pipe (i.e., arranged to extend in a direction that is at an angle to the axis of the pipe), and which is preferably centrally positioned. Thus, the septum advantageously effectively reduces the maximum size of the opening in the pipe by one-half. Moreover, the septum is preferably positioned so that when the electromagnetic interference shield is properly positioned relative to the optical transceiver, the septum will be located between a light-receiver and a light-emitter of the optical transceiver. Thus, the septum will significantly attenuate electromagnetic radiation waves (by reducing the maximum dimension of the aperture through which the electromagnetic radiation waves must pass), without hindering the connection of associated fiber-optic cables.

According to another exemplary aspect of the invention, the septum is disposed at an extreme end of the pipe. Thus, the placement of the septum will not interfere with the positioning of the pipe over the end of the optical transceiver. Moreover, the septum can serve as a mechanical stop, to ensure that the pipe is properly positioned relative to the end of the optical transceiver.

In a further exemplary aspect of the invention, the electromagnetic interference shield is provided with a number of conductive grounding springs, which are disposed around the outer periphery of the ends of the pipe. The grounding springs advantageously conductively couple the electromagnetic interference shield to a ground potential, and help to hold the electromagnetic interference shield in a fixed position, for example, by engaging with a conventional shield. Moreover, since it is conventional to fix the conventional shield to the circuit board on which the optical transceiver is disposed, the grounding springs likewise hold the electromagnetic interference shield in a predetermined position relative to the circuit board.

Additionally, when properly positioned, the grounding springs will engage with an inner edge of an aperture of a tailstock, thus advantageously holding the electromagnetic interference shield in a fixed position relative to the tailstock. Thus, the electromagnetic interference shield according to the present invention advantageously ensures that the conventional shield, the optical transceiver, and the aperture of the tailstock are properly aligned and positioned relative to one another.

The grounding springs may be integrally formed with the pipe. Thus, fewer separate components are necessary.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, in the application, and if used, the terms "upper", "lower", "front", "back", "over", "under", and similar such terms are not to be construed as limiting the invention to a particular orientation. Instead, these terms are used only on a relative basis.

Figure 1:
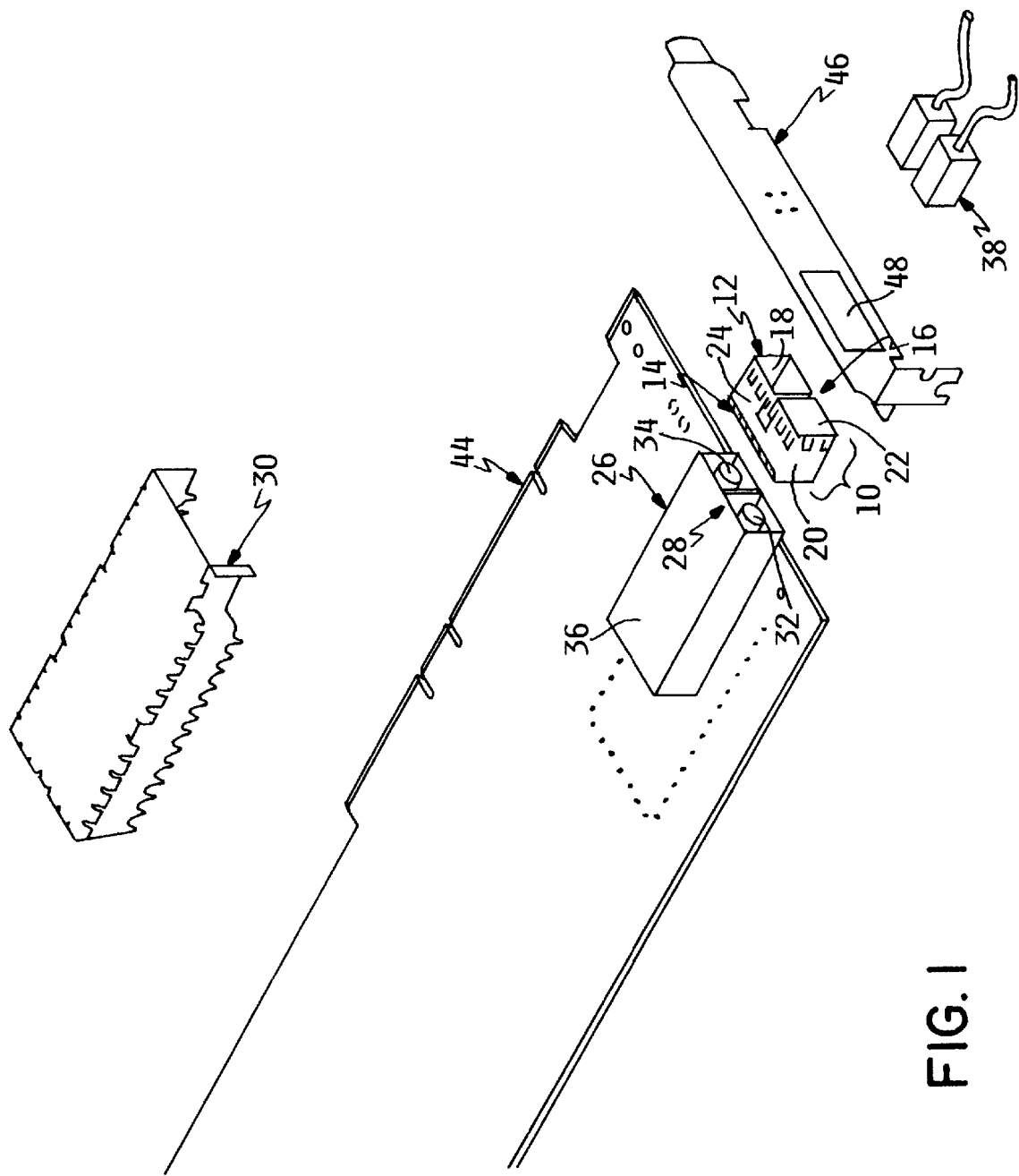
FIG. 1 is an exploded, perspective view of an exemplary embodiment of the present invention, together with an optical transceiver and other associated components.
Figure 2:
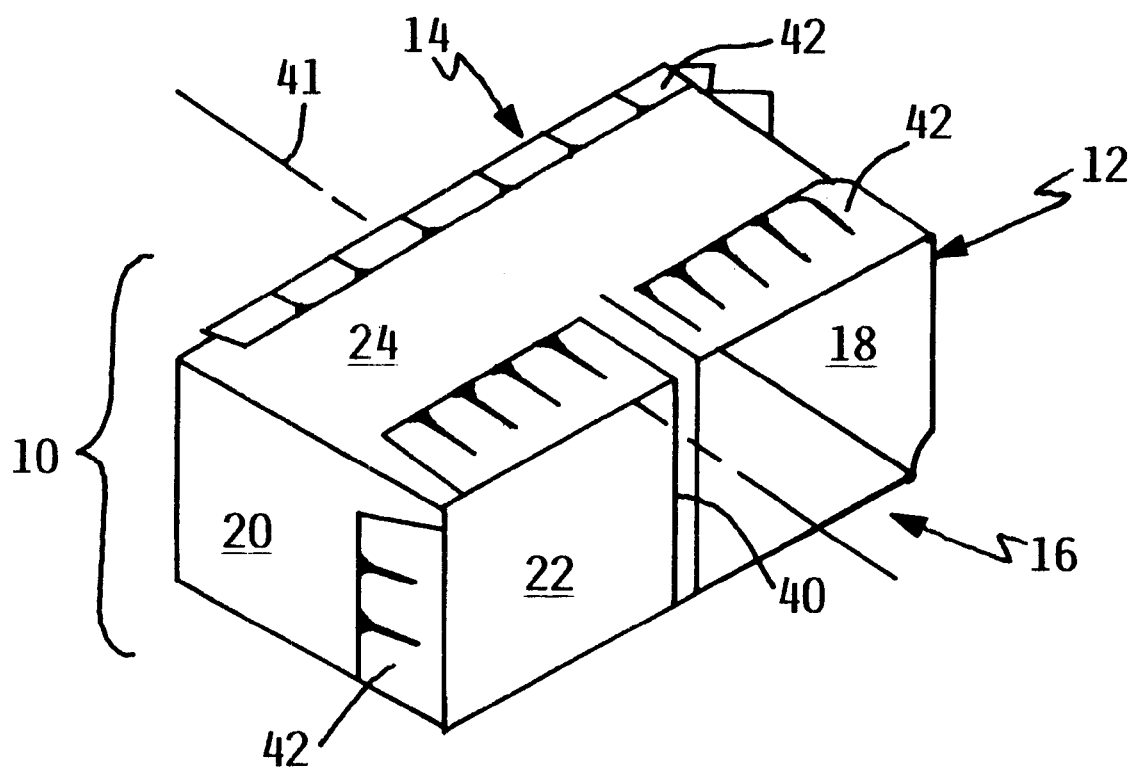
FIG. 2 is a perspective view of the electromagnetic interference shield shown in FIG. 1.

Referring to FIGS. 1 and 2, an exemplary embodiment of an electromagnetic interference shield 10 according to the present invention is shown. The electromagnetic interference shield 10 is preferably formed from a conductive, non-corrosive material, such as steel having a tin plating. However, the electromagnetic interference shield 10 can be formed of any material that will attenuate electromagnetic interference.

As shown, the electromagnetic interference shield 10 includes a hollow member, such as a pipe 12 that is open at opposing ends 14, 16. Further, the pipe 12 has a rectangular cross-sectional profile, and is defined by four contiguous, connected walls 18, 20, 22, 24, each of which is arranged at a right angle to an adjoining wall. This particular configuration conforms the electromagnetic interference shield 10 to the shape of a standard optical transceiver 26 (FIG. 1), which likewise has a rectangular cross-sectional profile. However, as will be appreciated, variations in the shape of the electromagnetic interference shield 10 can be made without departing from the spirit of the invention.

The electromagnetic interference shield 10 may be slipped over the end 28 of the optical transceiver 26, so as to totally encapsulate the end periphery of the optical transceiver. Alternatively, it is also contemplated that the electromagnetic interference shield 10 may be slipped within the end 28 of the optical transceiver 26. When properly positioned, the edge of the opening 16 of the electromagnetic interference shield 10 will be positioned essentially flush with the end 28 of the optical transceiver 26.

Preferably, all of the walls 18, 20, 22 and 24 have a width (i.e., a distance between the opposing ends 14, 16 of the shield) of about 15 millimeters, although other widths may be used without departing from the scope of the present invention. However, this particular width will sufficiently shield the end region of the optical transceiver 26 that is typically not covered using a conventional shield 30. Thus, the electromagnetic interference shield 10, when used in conjunction with a conventional shield 30, significantly increases the shielding coverage of the optical transceiver 26, as compared to the shielding effect provided using only a conventional shield 30.

Moreover, walls 18 and 20, which are disposed opposite and parallel to each other, have a height between about 10 and about 12 millimeters, and are preferably about 11 millimeters. Walls 22 and 24, which are likewise disposed opposite and parallel to each other, have a length between about 24 and about 27 millimeters, and are preferably about 25.5 millimeters. Since the typical duplex optical transceiver 26 has a lateral dimension of about 25.40 millimeters, and a height of about 10.35 millimeters, the electromagnetic interference shield 10 can be easily slipped over the end 28 thereof. Of course, if it is desired to place the electromagnetic interference shield 10 within the optical transceiver 26, the dimensions of the electromagnetic interference shield 10 can be appropriately modified.

As shown in FIG. 1, the optical transceiver 26 has a light-receiver 32, such as a photodiode, and a light-emitter 34, which may be an LED (light emitting diode) or laser, for example. Such optical transceivers, and their configuration and operation, are well known to those skilled in the art. As shown, both the light-receiver 32, and the light-emitter 34 are disposed within a body 36 of the optical transceiver 26, and positioned adjacent to the end 28. Moreover, as is also conventional, fiber-optic cables 38 are typically connected to the light-receiver 32, and the light-emitter 34, so as to allow the optical transceiver 26 to be coupled to other electrical devices. However, as will be appreciated, this requires that both the light-receiver 32, and the light-emitter 34 be accessible, i.e., not covered. As such, it is conventional to leave the end 28 of the optical transceiver 26 completely uncovered, and hence, unshielded.

It is also known that an aperture will attenuate electromagnetic radiation waves, and that the smaller the aperture, the greater the attenuation of the electromagnetic radiation waves. Therefore, and as best shown in FIG. 2, the electromagnetic interference shield 10 is provided with a septum 40 which extends from wall 22 to wall 24 (i.e., arranged to extend in a direction that is at an angle, for example, perpendicular, to an axis 41 of the pipe 12), and which is positioned centrally between walls 18 and 20, thus effectively reducing the size of the opening in the pipe 12 by one-half. Moreover, by positioning septum 40 between walls 18 and 20, when the electromagnetic interference shield 10 is properly positioned relative to the optical transceiver 26, the septum 40 will be located between the light-receiver 32 and the light-emitter 34. Thus, the septum 40 will significantly attenuate electromagnetic radiation waves (by reducing the maximum dimension of the aperture through which the electromagnetic radiation waves must pass), without hindering the connection of the fiber-optic cables 38 to the optical transceiver 26.

Preferably, the septum 40 comprises a band that is about 2 millimeters in width, for example. Of course, the septum 40 can have a different width, within the spirit of the invention. Moreover, the material of the septum 40 is preferably the same material as the pipe 12, for example, a conductive, non-corrosive material.

As shown, the septum 40 is disposed at the extreme end 16 of the pipe 12. Thus, the placement of the septum 40 will not interfere with the positioning of the pipe 12 over the end 28 of the optical transceiver 26. Moreover, the septum 40 can serve as a mechanical stop, to ensure that the pipe 12 is properly positioned relative to the end 28 of the optical transceiver 26.

Preferably, the electromagnetic interference shield 10 is provided with a number of conductive grounding springs 42, which are disposed around the outer periphery of the pipe 12 at the ends 14, 16. The grounding springs 42 conductively couple the electromagnetic interference shield 10 to a ground potential, in a manner which will be subsequently described.

Figure 3:
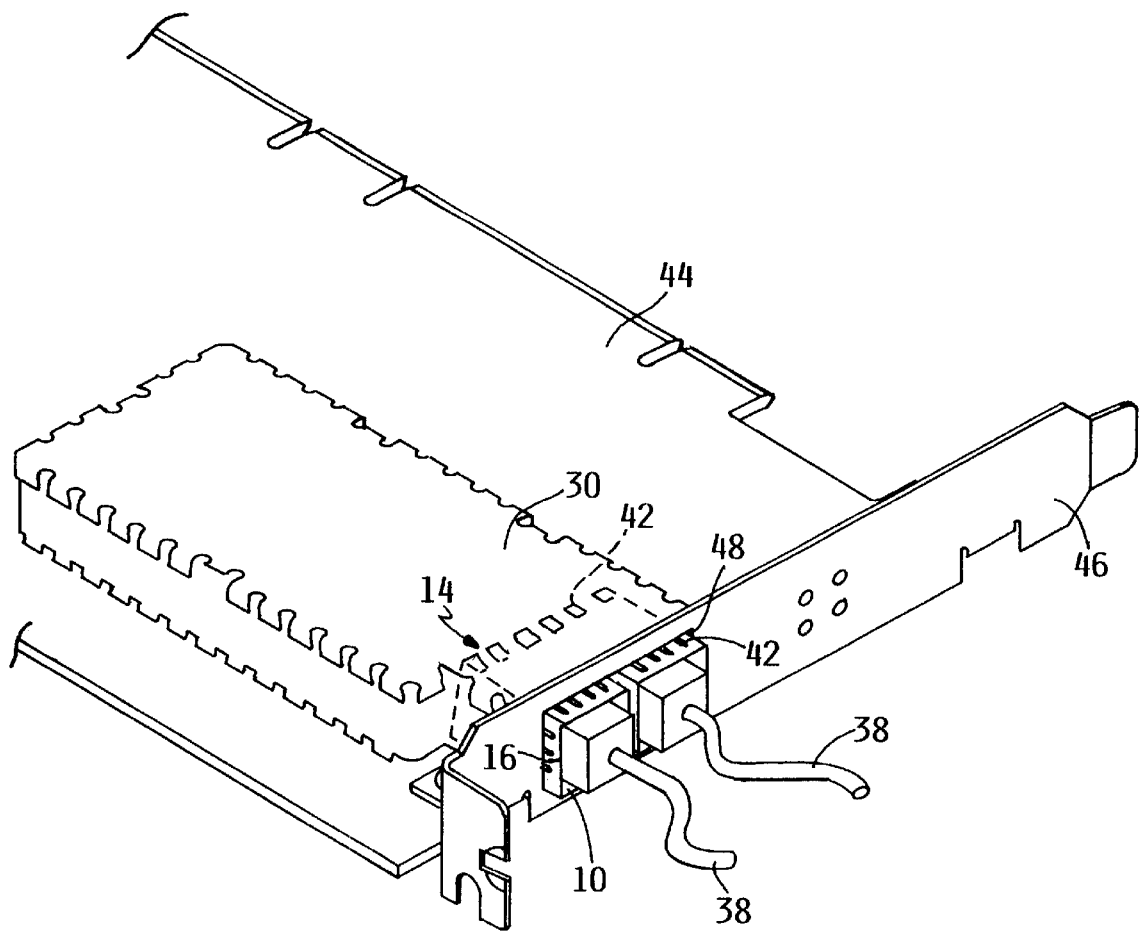
FIG. 3 is a perspective view of the exemplary embodiment of the present invention shown in FIG. 1, but in an assembled state.

When properly positioned, and referring also to FIG. 3, the grounding springs 42 that surround the outer periphery of the pipe 12 at end 14, engage with an inner surface of the conventional shield 30. This engagement holds the electromagnetic interference shield 10 in a fixed position relative to the conventional shield 30. Moreover, since it is conventional to fix the conventional shield 30 to the circuit board 44 on which the optical transceiver (not shown in FIG. 3) is disposed, the grounding springs 42 likewise hold the electromagnetic interference shield 10 in a predetermined position relative to the circuit board 44. Additionally, since the conventional shield 30 is typically grounded, for example, through its connection to circuit board 44, the electromagnetic interference shield 10 will likewise be grounded via its connection to conventional shield 30.

Additionally, it is also conventional to provide a tailstock 46 having an aperture 48, which allows access for the fiber-optic cable 38, so that the fiber-optic cable may be coupled to the light-receiver 32 and the light-emitter 34 (FIG. 1) of the optical transceiver 26. When properly positioned, the grounding springs 42 that surround the outer periphery of pipe 12 at end 16 engage with an inner edge of the aperture 48. This engagement holds the electromagnetic interference shield 10 in a fixed position relative to the tailstock 46. Thus, the electromagnetic interference shield 10 advantageously ensures that the conventional shield 30, the optical transceiver 26, and the aperture 48 of the tailstock 48 are properly aligned and positioned relative to one another.

The grounding springs 42 may be integrally formed with the pipe 12. For example, the grounding springs 42 can be formed as metal fingers which extend in the same plane, and contiguous with, a respective wall 18, 20, 22, 24. The metal fingers can then be bent so that the fingers are disposed essentially superposed to the respective wall 18, 20, 22, 24 they are attached to. However, due to the memory effect of the material, the fingers will exert a spring force that acts in a direction away from the walls 18, 20, 22, 24. Thus, the metal fingers will engage with the conventional shield 30, and the aperture 48 of the tailstock, in the aforementioned manner.

The electromagnetic interference shield 10 can be mathematically shown to significantly reduce electromagnetic radiation emissions. For example, the attenuation of electromagnetic radiation waves due to passage through an aperture can be determined using the following formula:

$$S = 20 \log (\lambda/2L), \text{ where}$$

S=the shielding effectiveness of the aperture (in decibels);
$\lambda$=the wavelength of the electromagnetic radiation (in meters); and
L=the maximum linear dimension of the aperture (in meters).

Moreover, the wavelength $\lambda$ can be determined by dividing the velocity of the electromagnetic radiation wave (i.e., the wave speed, which is approximately $3 \times 10^8$ m/sec) by the frequency of the electromagnetic radiation emissions.

If, for example, the third harmonic frequency of the electromagnetic radiation emissions is 2.488 GHz, then the wavelength $\lambda = (3 \times 10^8 \text{ m/sec})/2.488 \text{ GHz} => 0.120$ meters.

With a standard optical transceiver 26, the size of the aperture 48 in the tailstock 46 determines the attenuation that will be achieved. Since the conventional aperture 48 has a maximum linear length of about 29 millimeters (i.e., the diagonal distance across the aperture), the shielding effect using only a conventional shield 30 will be about $$S=20 \log (0.12/(2*0.029))=6 \text{ decibels}.$$

However, when the standard optical transceiver is provided with an electromagnetic interference shield 10, since the shield 10 fits within aperture 48, the maximum linear dimension of the aperture is about 15 millimeters. Thus, the shielding effect using a conventional shield 30 together with electromagnetic interference shield 10 will be about $$S=20 \log (0.12/(2*0.015))=12 \text{ decibels}.$$

As is apparent, the electromagnetic interference shield 10 provides for 6 more decibels of attenuation. Thus, even high speed optical transceivers may be used without exceeding most government's acceptable emission limits for electrical devices operating at set frequencies.

Figure 4:
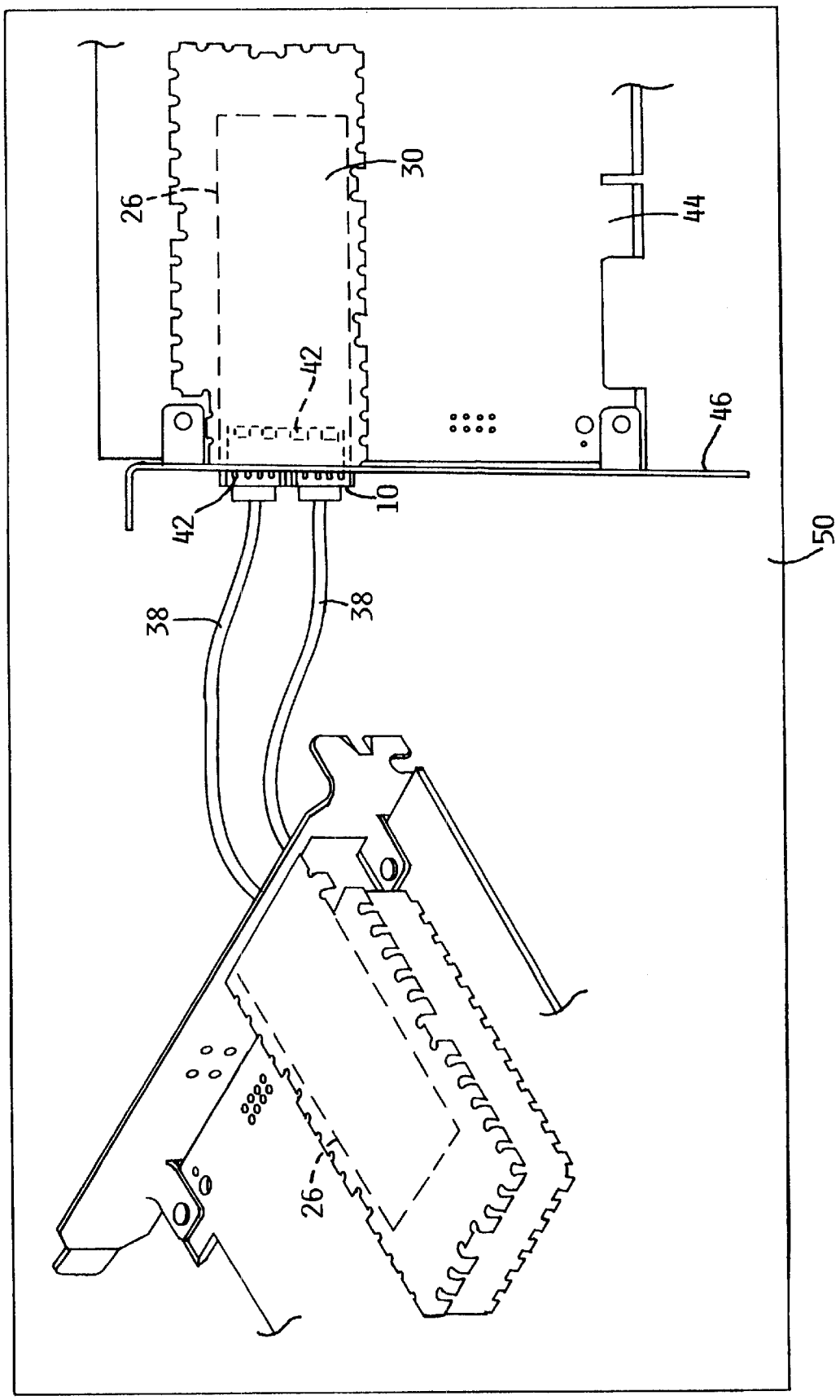
FIG. 4 is a view of the shield shown in FIG. 1, disposed within a computer housing, and with two optical transceivers coupled together.

Referring to FIG. 4, the optical transceiver 26 having the electromagnetic interference shield 10 attached thereto, is conventionally used in a computer system. Further, typically the optical transceiver 26 is coupled to a further optical transceiver 26, using the fiber-optic cables 38. Both optical transceivers are conventionally disposed within the same computer housing 50, although this is not required. Moreover, the present invention is not limited to use in computer systems, but can be utilized in a variety of applications.

As shown, the electromagnetic interference shield 10 is being used in conjunction with a conventional shield 30, although it may also be used on its own. Moreover, although the electromagnetic interference shield 10 has been described as a component separate from the conventional shield, it is contemplated that features of each shield can be combined into an integral, single unit, without departing from the invention. However, by providing for separate shields, placement of the electromagnetic interference shield 10 onto the optical transceiver 26 may be facilitated.

Although the above exemplary embodiments utilized a standard optical transceiver having set dimensions as an example, the electromagnetic interference shield 10 can be modified in size and configuration in accordance with specific requirements, without departing from the spirit of the invention. Moreover, the relativeness of the dimensions can likewise be changed without departing from the spirit of the invention. Further, the present invention is not limited to use with only an optical transceiver, but can be used in any application where it would be desirable to reduce emissions.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes, and adaptations, and the same are intended to be comprehended within the meaning and range of equivalents of the appended claims.

What is claimed is:

1. An electromagnetic interference shield, comprising:
    a hollow member formed from a conductive material, said hollow member having two opposing openings, and an axis extending from one of the openings to the other one of the openings;
    a septum attached to said hollow member, and being formed from a conductive material, said septum being arranged to extend in a direction that is at an angle to the axis; and
    a plurality of grounding springs, each being tailored as a conductive finger having a first end integrally attached to said hollow member in a region adjacent to an edge of the one of the openings, and a free second end that projects in a direction toward the other one of the openings, said plurality of grounding springs being disposed to at least partially surround the one of the openings;
    wherein each said grounding spring is biased so that when an external force is applied against the respective free second ends and in a direction toward said hollow member, the respective grounding springs will exert a spring force that acts in a direction away from said hollow member.

2. The electromagnetic interference shield defined in claim 1, wherein said hollow member comprises a pipe that attenuates electromagnetic radiation to a first level, and said septum attenuates electromagnetic radiation to a second level which is lower than the first level.

3. The electromagnetic interference shield defined in claim 2, wherein said pipe includes at least four contiguous walls connected together so that said pipe has a rectangular cross-sectional profile.

4. The electromagnetic interference shield defined in claim 3, wherein two first opposing ones of said walls have a height between about 10 millimeters and about 12 millimeters, and two second opposing ones of said walls have a length between about 24 millimeters and about 27 millimeters.

5. The electromagnetic interference shield defined in claim 4, wherein the two first opposing ones of said walls have a height of about 11 millimeters, and the two second opposing ones of said walls have a length of about 25.5 millimeters.

6. The electromagnetic interference shield defined in claim 5, wherein a distance between the two opposing openings of said pipe is about 15 millimeters.

7. The electromagnetic interference shield defined in claim 2, wherein said pipe is configured to fit over an end of an optical transceiver.

8. The electromagnetic interference shield defined in claim 2, wherein said septum is disposed at an end of said pipe.

9. The electromagnetic interference shield defined in claim 8, wherein said septum extends across a respective one of the opposing openings.

10. The electromagnetic interference shield defined in claim 9, wherein said septum divides the respective one of the opposing openings into two essentially equally-sized openings.

11. The electromagnetic interference shield defined in claim 2, wherein said pipe includes at least two first opposing walls having a height between about 10 millimeters and about 12 millimeters, and two second opposing walls having a length between about 24 millimeters and about 27 millimeters, said walls being contiguously connected together so that said pipe has a rectangular cross-sectional profile;
    wherein a distance between the two opposing openings of said pipe is about 15 millimeters;
    wherein said pipe is configured to fit over an end of an optical transceiver; and
    wherein said septum is disposed at an end of said pipe, extends across a respective one of the opposing openings, and divides the respective one of the opposing openings into two essentially equally-sized openings.

12. An electromagnetic interference shielding arrangement, comprising:

a duplex optical transceiver having a light-emitter and a light-receiver disposed adjacent to each other and at an end of said optical transceiver;

a first electromagnetic interference shield disposed over so as to cover a major portion of said optical transceiver;

a tailstock having an aperture disposed in alignment with the end of said optical transceiver; and a second electromagnetic interference shield positionable under said first electromagnetic interference shield and being adapted to shield the end of said optical transceiver, and comprising:

a pipe formed from a conductive material, said pipe having two opposing openings, and an axis extending from one of the openings to the other of the openings, said pipe having a profile that corresponds to a profile of the end of said optical transceiver to allow said pipe to be fit over the end of said optical transceiver to allow said pipe to be fit over the end of said optical transceiver; and a septum attached to said pipe, and being formed from a conductive material, said septum being arranged to extend in a direction that is at an angle to the axis.

13. The electromagnetic interference shielding arrangement defined in claim 12, wherein said pipe attenuates electromagnetic radiation emitted from said optical transceiver to a first level, and said septum attenuates the electromagnetic radiation emitted from said optical transceiver to a second level which is lower than the first level.

14. The electromagnetic interference shielding arrangement defined in claim 13, wherein said pipe includes at leas t two first opposing walls having a height between about 10 millimeters and about 12 millimeters, and two second opposing walls having a length between about 24 millimeters and about 27 millimeters, said walls being contiguously connected together so that said pipe has a rectangular cross-sectional profile;

wherein a distance between the two opposing openings of s aid pipe is about 15 millimeters;

wherein said pipe is configured to fit over the end of said optical transceiver; and wherein said septum is disposed at an end of said pipe, extends across a respective one of the opposing openings, and divides the respective one of the opposing openings into two essentially equally-sized openings, said septum being positioned between said light-emitter and said light-receiver when said pipe is fit over the end of said optical transceiver.

15. The electromagnetic interference shielding arrangement defined in claim 12, wherein said second electromagnetic interference shield further comprises a plurality of grounding springs, each being tailored as a conductive finger having a first end integrally attached to said pipe in a region adjacent to an edge of the one of the openings, and a free second end that projects in a direction toward the other one of the openings, said plurality of grounding springs being disposed to at least partially surround the one of the openings.

16. The electromagnetic interference shielding arrangement defined in claim 15, wherein said second electromagnetic interference shield further comprises a plurality of additional grounding springs, each being tailored as a conductive finger having a first end integrally attached to said pipe in a region adjacent to an edge of the other one of the openings, and a free second end that projects in a direction toward the one of the openings, said plurality of additional grounding springs being disposed in a row along the edge of the other one of the openings.

17. The electromagnetic interference shielding arrangement defined in claim 16, wherein the respective free second ends of said grounding springs engage with a lower surface of said first electromagnetic shield, with said grounding springs exerting a spring force against the lower surface of said first electromagnetic shield, when said second electromagnetic interference shield is positioned under said first electromagnetic interference shield, and wherein when said pipe is fit over the end of said optical transceiver, said pipe projects through the aperture of said tailstock, with the respective free second ends of said additional grounding springs engaging with, and exerting a spring force against, said tailstock at a periphery of the aperture.

18. The electromagnetic interference shielding arrangement defined in claim 16, wherein when said pipe is fit over the end of said optical transceiver, said pipe projects through the aperture of said tailstock, with the respective free second ends of said additional grounding springs engaging with, and exerting a spring force against, said tailstock at a periphery of the aperture.

19. The electromagnetic interference shielding arrangement defined in claim 15, wherein the respective free second ends of said grounding springs engage with a lower surface of said first electromagnetic shield, with said grounding springs exerting a spring force against the lower surface of said first electromagnetic shield, when said second electromagnetic interference shield is positioned under said first electromagnetic interference shield.

20. A computer, comprising:

a housing;

at least one circuit board disposed within said housing;

a first optical transceiver disposed on said circuit board, and having a light-emitter and a light-receiver disposed adjacent to each other and at an end of said optical transceiver;

a second optical transceiver disposed within said housing, and having at least one of a light-emitter and a light-receiver;

a fiber-optic cable coupling one of said light-emitter and said light-receiver of said first optical transceiver to said at least one of a light-emitter and a light-receiver of said second optical transceiver;

a first electromagnetic interference shield disposed over so as to cover a major portion of said first optical transceiver, and being connectable to said circuit board;

a tailstock having an aperture disposed in alignment with the end of said first optical transceiver, the aperture allowing said fiber-optic cable to be coupled to the one of said light-emitter and said light-receiver of said first optical transceiver; and a second electromagnetic interference shield positionable under said first electromagnetic interference shield and being adapted to shield the end of said first optical transceiver, and being connectable to said tailstock, said second electromagnetic interference shield comprising:

a pipe formed from a conductive material, said pipe having two opposing openings, and an axis extending from one of the openings to the other of the openings, said pipe having a profile that corresponds to a profile of the end of said first optical transceiver; and a septum attached to said pipe, and being formed from a conductive material, said septum being arranged to extend in a direction that is at an angle to the axis.

21. The computer defined in claim 20, wherein said pipe attenuates electromagnetic radiation emitted from said first optical transceiver to a first level, and said septum attenuates the electromagnetic radiation emitted from said first optical transceiver to a second level which is lower than the first level.

22. The computer defined in claim 21, wherein said pipe includes at least two first opposing walls having a height between about 10 millimeters and about 12 millimeters, and two second opposing walls having a length between about 24 millimeters and about 27 millimeters, said walls being contiguously connected together so that said pipe has a rectangular cross-sectional profile;

wherein a distance between the two opposing openings of said pipe is about 15 millimeters;

wherein said pipe is configured to fit over the end of said first optical transceiver; and wherein said septum is disposed at an end of said pipe, extends across a respective one of the opposing openings, and divides the respective one of the opposing openings into two essentially equally-sized openings, said septum being positioned between said light-emitter and said light-receiver of said first optical transceiver when said pipe is fit over the end thereof.

23. The computer defined in claim 20, wherein said second electromagnetic interference shield further comprises a plurality of grounding springs, each being tailored as a conductive finger having a first end integrally attached to said pipe in a region adjacent to an edge of the one of the openings, and a free second end that projects in a direction toward the other one of the openings, said plurality of grounding springs being disposed to at least partially surround the one of the openings.

24. The computer defined in claim 23, wherein said second electromagnetic interference shield further comprises a plurality of additional grounding springs, each being tailored as a conductive finger having a first end integrally attached to said pipe in a region adjacent to an edge of the other one of the openings, and a free second end that projects in a direction toward the one of the openings, said plurality of additional grounding springs being disposed in a row along the edge of the other one of the openings.

25. The computer defined in claim 24, wherein the respective free second ends of said grounding springs engage with a lower surface of said first electromagnetic shield, with said grounding springs exerting a spring force against the lower surface of said first electromagnetic shield, when said second electromagnetic interference shield is positioned under said first electromagnetic interference shield, and wherein when said pipe is fit over the end of said first optical transceiver, said pipe projects through the aperture of said tailstock, with the respective free second ends of said additional grounding springs engaging with, and exerting a spring force against, said tailstock at a periphery of the aperture.

26. The computer defined in claim 24, wherein when said pipe is fit over the end of said first optical transceiver, said pipe projects through the aperture of said tailstock, with the respective free second ends of said additional grounding springs engaging with, and exerting a spring force against said tailstock at a periphery of the aperture.

27. The computer defined in claim 23, wherein the respective free second ends of said grounding springs engage with a lower surface of said first electromagnetic shield, with said grounding springs exerting a spring force against the lower surface of said first electromagnetic shield, when said second electromagnetic interference shield is positioned under said first electromagnetic interference shield.

28. An electromagnetic interference shield, comprising:

a hollow member formed from a conductive material, said hollow member having two opposing openings, and an axis extending from one of the openings to the other one of the openings;

a septum attached to said hollow member, and being formed from a conductive material, said septum being arranged to extend in a direction that is at an angle to the axis;

a plurality of grounding springs, each being tailored as a conductive finger having a first end integrally attached to said hollow member in a region adjacent to an edge of the one of the openings, and a free second end that projects in a direction toward the other one of the openings, said plurality of grounding springs being disposed to at least partially surround the one of the openings; and a plurality of additional grounding springs, each being tailored as a conductive finger having a first end integrally attached to said hollow member in a region adjacent to an edge of the other one of the openings, and a free second end that projects in a direction toward the one of the openings, said plurality of additional grounding springs being disposed in a row along the edge of the other one of the openings;

wherein each said grounding spring, and each said additional grounding spring, is biased so that when an external force is applied against the respective free second ends and in a direction toward said hollow member, the respective grounding springs and respective additional grounding springs will exert a spring force that acts in a direction away from said hollow member.

* * * * *